US 6,739,047 B2

(12) United States Patent
Hammond et al.

(10) Patent No.: US 6,739,047 B2
(45) Date of Patent: May 25, 2004

(54) METHOD OF MAKING CERAMIC MULTILAYER CIRCUIT BOARDS MOUNTED IN A PATTERNED METAL SUPPORT SUBSTRATE

(75) Inventors: Mark Stuart Hammond, Pennington, NJ (US); Ellen Schwartz Tormey, Princeton Junction, NJ (US); Barry Jay Thaler, Lawrenceville, NJ (US); Leszek Hozer, Plainsboro, NJ (US); Hung-tse Daniel Chen, San Jose, CA (US); Bernard Dov Geller, Durham, NC (US); Gerard Frederickson, Yardley, PA (US)

(73) Assignee: Lamina Ceramics, Inc., Westampton, NJ (US)

( * ) Notice: Subject to any disclaimer, the term of this patent is extended or adjusted under 35 U.S.C. 154(b) by 0 days.

(21) Appl. No.: 10/284,544

(22) Filed: Oct. 30, 2002

(65) Prior Publication Data

US 2003/0062185 A1 Apr. 3, 2003

Related U.S. Application Data

(62) Division of application No. 09/852,901, filed on May 10, 2001, now Pat. No. 6,518,502.

(51) Int. Cl.$^7$ .................................................. H05K 3/02
(52) U.S. Cl. ............................. 29/847; 29/848; 29/851; 29/831; 29/830; 156/320; 174/52.4; 428/209
(58) Field of Search .......................... 29/847, 851, 848, 29/846, 831, 830; 156/320; 174/52.4; 428/209

(56) References Cited

U.S. PATENT DOCUMENTS

| 5,581,876 | A | * | 12/1996 | Prabhu et al. ................. 29/851 |
| 5,801,073 | A | * | 9/1998 | Robbins et al. .............. 438/125 |
| 5,821,617 | A | * | 10/1998 | Autry et al. ................. 257/701 |
| 5,847,935 | A | * | 12/1998 | Thaler et al. ................ 361/761 |
| 5,940,271 | A | | 8/1999 | Mertol ........................ 361/704 |
| 6,008,991 | A | | 12/1999 | Hawthorne et al. ......... 361/707 |

* cited by examiner

Primary Examiner—Carl J. Arbes
Assistant Examiner—Tim Phan
(74) Attorney, Agent, or Firm—Lowenstein Sandler PC

(57) ABSTRACT

A package for an electronic component includes a metal support substrate having a pattern of openings therethrough and a body of an insulating material, such as glass or ceramic, on and bonded to the surface of the support substrate. The body is formed from a plurality of layers of an insulating material, and conductive vias extending through the plurality of layers to the support substrate; said insulating body having an opening therein, an electronic component directly mounted in said opening to the patterned base plate. The base plate can be cut into one or more modules and directly soldered to a motherboard having additional devices mounted thereon.

6 Claims, 2 Drawing Sheets

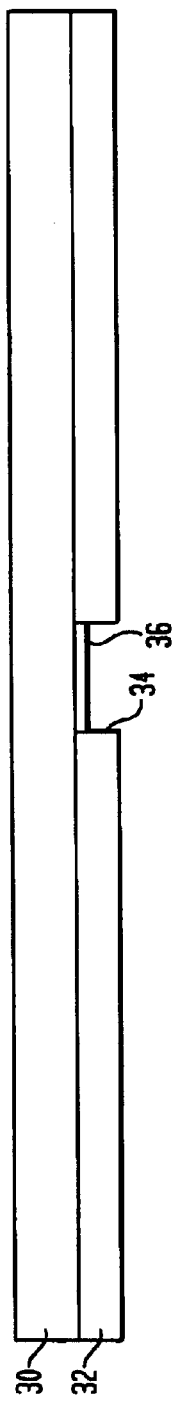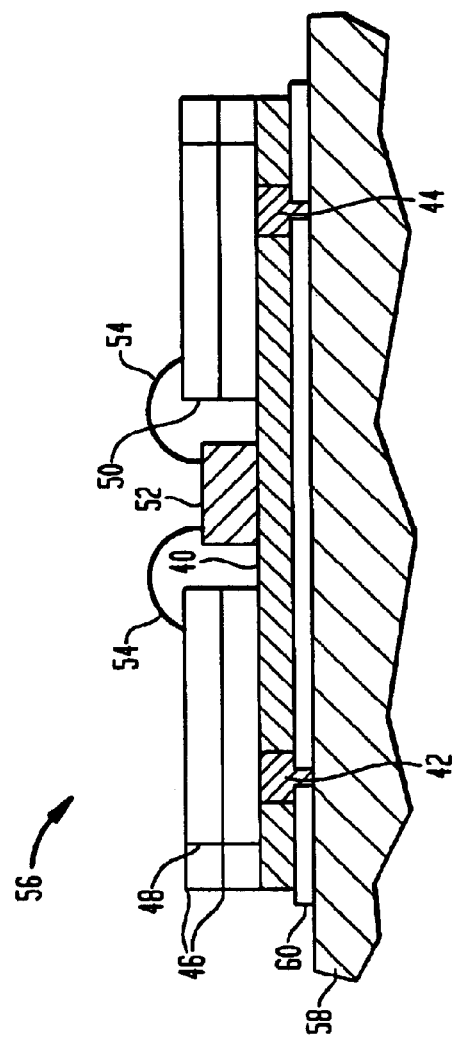

METHOD OF MAKING CERAMIC MULTILAYER CIRCUIT BOARDS MOUNTED IN A PATTERNED METAL SUPPORT SUBSTRATE

CROSS REFERENCE TO RELATED APPLICATIONS

The present application is a division of U.S. patent application Ser. No. 09/852,901, filed on May 10, 2001 (now U.S. Pat. No. 6518,502, issued on Feb. 11, 2003).

This invention relates to multilayer ceramic circuit boards mounted on a patterned conductive substrate support and method of making. More particularly, this invention relates to mounting modules of high power amplifiers and oscillators onto the patterned substrate support to remove excess thermal energy from these devices.

BACKGROUND OF THE INVENTION

U.S. Pat. No. 5,847,935 to Thaler et al describes an electronic circuit chip package which includes a base plate of an electrically and/or thermally conductive material, such as a metal plate, having a body of an insulator adhered to the base plate. This insulator body may comprise a plurality of glass-ceramic layers having printed circuitry thereon. Conductive vias through the ceramic layers connect the circuits electrically to each other. At least one opening is formed in the insulator body through to the support substrate, the opening having a size so as to accommodate at least one electronic device or module. The electronic device is mounted directly onto the conductive base plate. Wires are used to connect terminals in the electronic device to terminal strips in the circuitry.

This technology is known as low temperature co-fired ceramic circuit boards with metal support substrates, or LTCC-M technology. This technology permits the inclusion of active and passive devices between the glass-ceramic layers, as well as the inclusion of transmission lines, capacitors, resistors and the like.

When mounting high power amplifier and oscillator electronic devices to a substrate, a common problem is that of removing excess thermal energy from the devices, so that the active devices and circuit components are maintained at operating temperatures consistent with reliable performance.

The metal substrate support of the above-described LTCC-M technology can serve also as a heat spreader, or heat sink, which is advantageous in that modules can be directly mounted to the metal substrate such that they have an improved heat energy path. Thus by mounting high power components, such as amplifiers and oscillators, in an opening through the glass-ceramic layers directly onto a metal substrate support, minimal heat resistance to the heat sink can be achieved. The failure rate (MTTF) of power amplifiers and oscillators, as well as other high power devices, can thus be reduced markedly.

However, it would be desirable to be able to surface mount the above LTCC-M modules to a motherboard for increased integration. In order to do that, the signal-power leads can be desirably soldered directly to appropriate contacts on the motherboard. Such a configuration requires that the power and signal leads of the module are brought through the heat sink. Such a configuration would improve reliability and reduce manufacturing costs. However, forming openings through the metal support substrate in a completed LTCC-M device is expensive and presents various problems of manufacturability. Thus heat sinked modules for high power devices that can be readily made at low cost would be highly desirable.

SUMMARY OF THE INVENTION

We have found that by patterning the metal support in an LTCC-M module so as to be able to provide openings through the metal support prior to mounting one or more high power modules thereon, and applying solder pads to both sides of the support, the power and the signal leads of devices thereon, and heat sinking of the module, can all be achieved. Through vias in the ceramic layers of the LTCC-M module are directly connected to the top side of the metal support substrate, which also acts as a heat sink for a high power module.

Another aspect of the invention includes a dielectric paste that is screen printed onto the bottom side of the LTCC-M module so that the dielectric paste is aligned with the openings in the metal substrate support. This dielectric paste prevents shrinkage in the x and y dimensions of the green tapes mounted in those areas that overlie the openings in the metal substrate. After laminating the prepared module to the prepared substrate, and firing, the dielectric, now a powder, is readily removed.

This design further permits high integration because the above heat sink and module and other circuitry can be directly soldered from the bottom side of the substrate support to solder pads on a motherboard, which can include additional devices.

BRIEF DESCRIPTION OF THE DRAWING

FIG. 3 is a cross sectional view of a multilayer ceramic tape with a patterned metal support substrate of the invention.

FIG. 4 illustrates a cross section of a power module of the invention soldered to a motherboard.

DETAILED DESCRIPTION OF THE INVENTION

Figure 1:
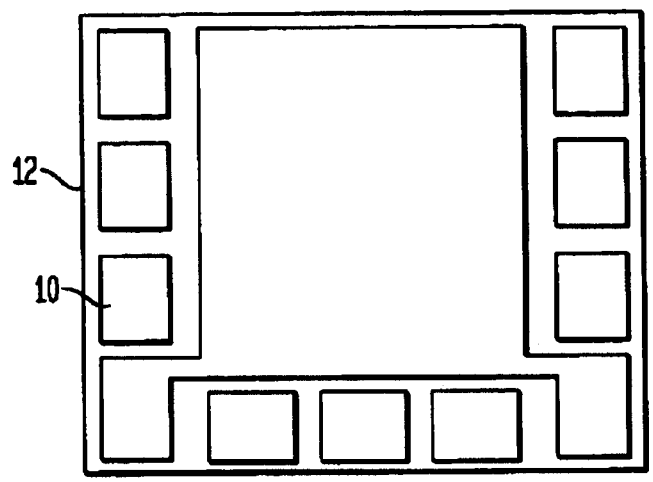
FIG. 1 is a bottom view of an example of a high power module of the invention.

The metal support substrate is prepared by first forming openings through the metal support, as by cutting, laser cutting, etching, electro discharge machining or punching openings to permit electrical connection of devices mounted on one side (the top side) of the metal substrate to the bottom side. These openings provide through connection of all of the devices built onto the top side of the metal support to the bottom side of the metal support.

After patterning the support substrate, it is nickel plated. A solder paste is then screen printed to both sides of the metal support, using a suitable screen printable conductive solder ink. A suitable silver-palladium screen printable solder ink can be made by mixing 20 parts by weight of silver or silver-palladium powders, such as one available from Degussa Corp. as K!P 3030; 0.6737 part by weight of a glass powder having the following composition: 103.72 parts by weight of zinc oxide powder; 103.0 parts by weight of magnesium oxide powder; 78.2 parts by weight of boric anhydride, all available from J. T. Baker; 115.08 parts by weight of silicon oxide powder, 20.0 parts by weight of aluminum oxide, and 01036 part by weight of boron powder having a particle size of 0.8 micron. This glass composition is mixed with an organic vehicle made by mixing 0.33 part by weight of Hypermer PS 2 dispersant from ICI Americas, Inc; and 3.56 parts by weight of an ethyl cellulose-solvent mixture comprising 19.4 parts by weight of ethyl cellulose having a molecular weight of 300; 18.8 parts by weight of an ethyl cellulose having a molecular weight of 14; 133 parts by weight of butyl carbitol; 88.8 parts by weight of dodecanol; and 0.2 part by weight of lecithin to form a screen printable ink. The same organic vehicle can also be used for the dielectric paste.

The support substrate is then fired in nitrogen at temperatures of about 750–800° C. to densify the solder ink.

The support substrate is then oxidized by heating in air at a temperature of about 800–850° C. A glaze is screen printed on one side of the patterned substrate, in the same pattern as the substrate. The glazed substrate is fired again in air at a temperature of about 750° C. to densify the glaze. The glaze ink acts to adhere components to the top side of the substrate support. An organic binder and solvent adhesion promoter can be applied to the top side of the substrate support for additional adhesion of mounted components.

After preparation of the support substrate as above, a multilayer green tape stack, including circuitry and embedded devices as desired, and made of a glass composition that is thermally matched to the support substrate, is screen printed on the side to be adhered to the support substrate with a high temperature dielectric paste, in a pattern that is the mirror image of the pattern of openings in the support substrate. Thus, when the green tape stack is aligned with the support substrate, the dielectric paste covers the openings in the substrate. This dielectric paste prevents x and y shrinkage in the overlying green tapes during firing in areas that are exposed, i.e., areas over the openings in the substrate support, that would be otherwise subject to such shrinkage.

Suitable inert and stabilizing materials for the dielectric paste comprise a high sintering temperature oxide of a metal, such as alumina or zirconia, having a higher firing temperature than the green tapes. These dielectrics are mixed with organic materials, such as organic resins and solvents, to form a screen printable paste.

A suitable high temperature dielectric paste comprises 20.0 parts by weight of alumina powder having a median particle size of about 40 microns, 16 parts by weight of an organic vehicle and 0.2 parts by weight of lecithin.

The prepared metal support and the laminated green tape stack are then co-laminated under heat and pressure by applying a polyethylene terephthalate tape over the green tapes. The green tapes are mounted and aligned so that the pattern in the green tapes corresponds to the openings in the metal support, now filled with dielectric or stabilizing paste., and placed between two copper plates. The resulting sandwich is heated to about 200° F. and pressed in a uniaxial press using 750 pounds of force for about two minutes.

The co-laminate is then fired in a belt furnace at a temperature of from about 850–900° C. Upon firing, the organic materials are vaporized, the glasses are densified, and the dielectric paste is now a powdered material that can be readily removed from the openings in the metal support substrate by brushing, or by immersing in an ultrasonic bath, as of isopropyl alcohol.

Alternatively, the dielectric or stabilizing paste can be applied to the ceramic after the co-lamination step by squeezing or doctor blading the paste into the openings in the metal support from the backside of the co-laminate, or by dispensing the paste into the openings with a syringe.

One of more openings can be made in the ceramic layer for insertion of a power module directly mounted to the metal support substrate. This module can be soldered onto a motherboard which may include other devices.

FIG. 1 is a bottom view of a high power module of the invention. The dark areas 10 illustrate the patterned metal substrate, and the light areas 12 illustrate edges of the ceramic module.

Figure 2:
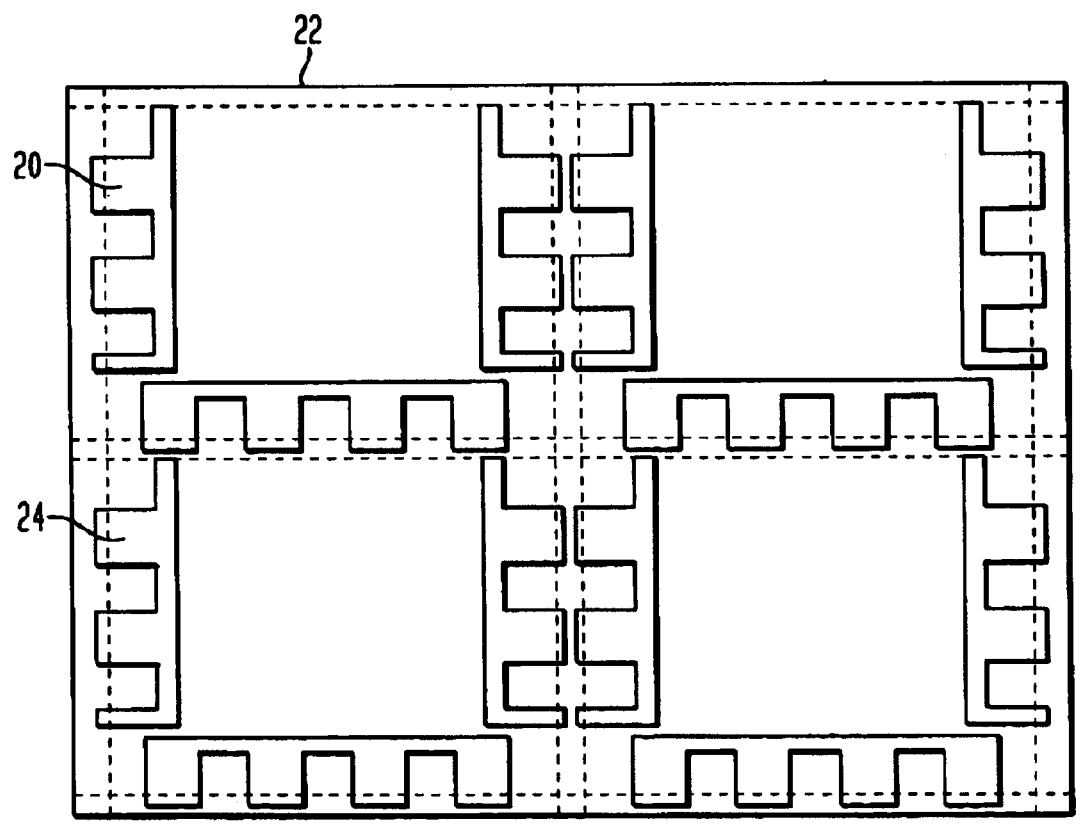
FIG. 2 is a schematic layout of a plurality of high power modules of the invention that can be cut into single modules.

FIG. 2 is a schematic layout of a patterned metal support substrate. The light areas 20 are those in which metal will be removed, as by punching. The darker areas 22 show the remaining metal support substrates. After completion of the modules, they can be separated by sawing along the dashed lines 24.

FIG. 3 is a cross sectional view of a multilayer ceramic tape 30 on a patterned metal support substrate 32. The metal support 32 has an opening 34 punched through it, which is at least partially filled with a high melt temperature inert dielectric or stabilization layer 36. The stabilization layer 36 prevents shrinkage of the green tape layers situated over the opening 34 in the x and y directions during firing.

The metal substrates are then cut into individual modules, as shown in FIG. 2. These modules have isolated pads along their periphery and a central ground plane which can be directly soldered to a motherboard having suitable bond pads thereon. This method forms low inductance-high speed RF connections to the motherboard. The metal support substrate provides good heat dissipation for the modules.

FIG. 4 illustrates a patterned metal support substrate 40 having openings 42, 44 (pad openings) therein from which the high melt temperature dielectric 36 has been removed. Multilayer ceramic circuits 46 are mounted on the patterned metal support substrate 40. Conductive vias 48 through the ceramic layers connect the circuitry 46 to the patterned metal support 40. An opening 50 formed in the ceramic layers 46 provides for mounting a power amplifier die 52 directly onto the patterned metal support 40. This die 52 can be connected to the multilayer ceramic circuitry 46 by means of wire bonds 54.

The resultant module 56 is mounted on a motherboard 58 so that solder connections on the bottom side of the metal support are aligned with solder connections 60 made on the motherboard 58. The module 56 is thus electrically connected to the motherboard 58.

The invention will be further described in the following examples, but the invention is not meant to be limited by the details described therein. Other glasses, resins, dielectric powders, metal support substrates and the like can be substituted, as will be well known to those skilled in the art.

EXAMPLE 1

Preparing a Patterned Metal Substrate

A copper clad molybdenum sheet about 10 mils in thickness was cut into support substrates 2" by 2". Each substrate was electro-discharge machined with a hole pattern, such as that shown in FIG. 2. The substrates were then electroplated with nickel to a coating thickness of about 1 mil. A solder paste was screen printed onto both sides of the support substrate and fired in nitrogen at 750–800° C. and oxidized by passing through an air fired furnace having a peak temperature of about 800–850° C. One side was glazed in a pattern the same as the metal pattern. The glazed substrate were then heated in an air fired belt furnace to a maximum temperature of 750° C. to densify the glass. A glue composition comprising organic binders and solvent was screen printed over the fired glaze layer.

A two layer ceramic tape comprising a glass thermally matched to the metal substrate support was screen printed on one side with an inert or stabilizing dielectric paste, such as that described above, in a pattern matching the openings in the metal substrate.

A co-laminate was made by placing the pre-cut two layer ceramic tape over the substrate, adding a Mylar film on top, sandwiching the tape and metal support between two copper plates and co-laminating by applying pressure in a uniaxial press at 200° F. using 750 lbs of force for two minutes. A dielectric tape was co-laminated to the bottom of the metal support in the same or separate co-lamination step.

The dielectric pattern on the green tape was aligned with the openings in the metal support substrate. The stabilizing dielectric paste present in the openings of the metal core constrains shrinkage during firing of those portions of the green tape which are not in direct contact with the metal core, and thus which are otherwise free to shrink in all x, y and z directions, causing tearing of the green tapes adjacent to the openings in the substrate.

EXAMPLE 2

Assembling a Module of Example 1 to a Motherboard

The fired ceramic layers adhered to the patterned metal support substrate have one or more openings of a size for directly mounting one or more power modules, such as a power amplifier or oscillator, to the metal support substrate. These power modules can be connected to the circuitry in the ceramic layers by means of wire bonds. The metal support substrate acts as a heat sink.

The powder remaining in the openings in the metal support substrate is readily removed by brushing or by immersing in an ultrasonic bath of, for example, isopropyl alcohol.

After cutting the substrates to form individual modules having isolated pads about their periphery and a central ground plane, the power modules can be soldered to a motherboard directly by solder connecting to suitable pads on the motherboard. Other device die also can be directly mounted to the metal support substrate through suitable openings in the ceramic layers in like manner. This eliminates the need for lead frames and pins to make connections between devices.

Suitably vias through the multilayer ceramic layers are made of silver to electrically connect the top surface of the ceramic circuits and/or conductors to the bottom side signal and/or ground pads formed in the metal support substrate by the patterning and cutting operations.

Although the invention has been described in terms of specific embodiments, the invention is not meant to be limited to the details described herein, but only by the scope of the appended claims.

We claim:

1. A method of forming a high power device module comprising
   a) forming a pattern of pad openings completely through the metal support substrate;
   b) electroplating said support substrate with nickel;
   c) screen printing a patterned conductive solder ink onto both sides of said support substrate;
   d) firing said support substrate in nitrogen;
   e) oxidizing the nickel layer by heating in air;
   f) applying a glazing layer onto the top of said support substrate;
   g) mounting a multilayer green tape stack having circuitry on each green tape onto the glazed surface of the support substrate;
   h) laminating the green tape stack to the patterned support substrate;
   i) filling the openings in the metal support substrate with a high melt temperature dielectric stabilization paste; and
   j) firing said module.

2. A method according to claim 1 wherein the dielectric stabilization paste comprises a metal oxide selected from the group consisting of aluminum oxide, zirconium oxide and a mixture of aluminum oxide and zirconium oxide, together with an organic vehicle.

3. A method according to claim 1 wherein an opening is made in the multilayer ceramic stack through to the support substrate.

4. A method according to claim 3 wherein a high power electronic device is mounted in said opening and connected to the multilayer stack circuitry.

5. A method according to claim 4 wherein the circuits on the multilayer stack are connected through to the support substrate with silver.

6. A method according to claim 5 wherein the module is soldered to a motherboard.

* * * * *